United States Patent [19]

Beffa

[11] Patent Number: 6,128,756

[45] Date of Patent: *Oct. 3, 2000

[54] SYSTEM FOR OPTIMIZING THE TESTING AND REPAIR TIME OF A DEFECTIVE INTEGRATED CIRCUIT

[75] Inventor: Ray Beffa, Boise, Id.

[73] Assignee: Micron Technology, Inc., Boise, Id.

[*] Notice: This patent is subject to a terminal disclaimer.

[21] Appl. No.: 09/150,289

[22] Filed: Sep. 9, 1998

Related U.S. Application Data

[63] Continuation of application No. 08/693,750, Aug. 7, 1996, Pat. No. 5,867,505.

[51] Int. Cl.⁷ .................................................. G11C 29/00
[52] U.S. Cl. ........................................ 714/718; 714/719
[58] Field of Search ..................................... 714/718, 723, 714/719, 724; 365/201; 324/73.1, 158.1

[56] References Cited

U.S. PATENT DOCUMENTS

| | | | |
|---|---|---|---|
| 3,659,088 | 4/1972 | Boisvert, Jr. ............................ | 714/723 |
| 3,664,499 | 5/1972 | Sahakian ................................. | 209/573 |
| 4,363,407 | 12/1982 | Buckler et al. ...................... | 324/73 AT |
| 4,510,673 | 4/1985 | Shils et al. ............................ | 29/574 |
| 5,465,850 | 11/1995 | Kase ...................................... | 324/759 |
| 5,550,838 | 8/1996 | Okajima ................................ | 714/719 |
| 5,867,505 | 2/1999 | Beffa .................................... | 714/718 |

Primary Examiner—Hoa T. Nguyen
Attorney, Agent, or Firm—Dickstein Shapiro Morin & Oshinsky, LLP

[57] ABSTRACT

A method and apparatus for testing semiconductor memory chips, such as DRAMs, having a plurality of memory cells or bits. Each memory chip has a unique identifier stored in a database. Tests are performed on the memory chips and when a memory chip fails a test, the memory chip is placed in a repair bin and a test identifier is stored in the database in association with the memory chip identifier. In order to repair the memory chip, failed tests are read out of the database and such tests are again performed on the failed memory chip in order to determine which memory cell in the memory chip is faulty. The failed memory cells are then repaired.

13 Claims, 4 Drawing Sheets

SYSTEM FOR OPTIMIZING THE TESTING AND REPAIR TIME OF A DEFECTIVE INTEGRATED CIRCUIT

This application is a continuation of application Ser. No. 08/693,750 filed Aug. 7, 1996, now U.S. Pat. No. 5,867,505 which is hereby incorporated by reference.

BACKGROUND OF THE INVENTION

1. Field of the Invention

The present invention relates generally to the field of testing a semiconductor memory chip and more specifically to optimizing repair time using a fuse identifier associated with the semiconductor memory chip.

2. Discussion of the Related Art

In order to ensure that a semiconductor device, such as a DRAM, is reliable, multiple tests are performed on the device before and after packaging.

A DRAM includes an array of memory cells or bits in rows and columns. After packaging, a plurality of tests are performed on the device in order to determine whether there is a defect in the array of bits that will fail over time. For example, burn-in testing is performed to accelerate failure using voltage and temperature stress. When a failed memory cell is detected, the row or column in which the failed memory cell is located is substituted by a redundant row or column, respectively. After packaging, this substitution is performed using antifuses in the memory chip.

Antifuses are capacitors including two conductive layers spaced by a thin insulative material, such as silicon nitride. Under normal biasing conditions, no DC current flows through the antifuse. Upon application of an excessive bias across the two conductive layers, however, the thin insulative material breaks down, thereby shorting the two conductive layers. Thus, redundant memory elements coupled to the antifuses can be selectively connected to circuitry external to the memory array by applying the excessive bias to desired antifuses.

If a memory chip fails any one of the tests, it is placed in a failure bin and becomes a candidate for antifuse repair. During the repair step, redundancy analysis is performed on each of the failed memory chips which involves repeating tests in order to identify specific bits that have failed. Once a failed bit is located, either the entire row or column in which it is located is replaced with a corresponding redundant row or column. Redundancy analysis has half the throughput of the initial testing analysis because the initial analysis typically tests 64 sites wide on a chip such as 16M DRAM while redundancy analysis only tests 32 sites wide on the memory chip.

Due to the relatively large amount of time required to perform redundancy analysis, only a subset of tests are run, such as the ten most commonly failed tests. However, faulty memory cells in chips failing tests not among these top ten failing tests will not be detected and repaired during redundancy analysis.

SUMMARY OF THE INVENTION

In accordance with the purpose of the invention, as embodied and broadly described herein, a method is provided for testing integrated circuits or semiconductor memory chips, such as DRAMs, having a plurality of bits or memory cells. Each memory chip has a unique identifier, preferably a fuse identifier having a series of selectively blown fuses corresponding to a unique binary number, located on the memory chip. The information contained in the fuse identifier is also stored in a database. Tests are performed on the memory chips and when a memory chip fails a test, the memory chip is placed in a repair bin and the failed test identifier is stored in the database with the associated memory chip identifier. In order to repair the memory chip, failed test data are read out of the database and only selected tests which the chips failed are again performed on the failed memory chip in order to determine which bit in the memory chip is faulty. The failed bits are then repaired preferably by substitution of redundant rows or columns.

BRIEF DESCRIPTION OF THE DRAWINGS

The accompanying drawings, which are incorporated in and constitute a part of the specification, illustrate an embodiment of the invention and, together with the description, serve to explain the advantages and principles of the invention. In the drawings.

DETAILED DESCRIPTION OF THE PREFERRED EMBODIMENTS

Reference will now be made in detail to the construction and operation of preferred implementations of the present invention which are illustrated in the accompanying drawings.

Figure 1:
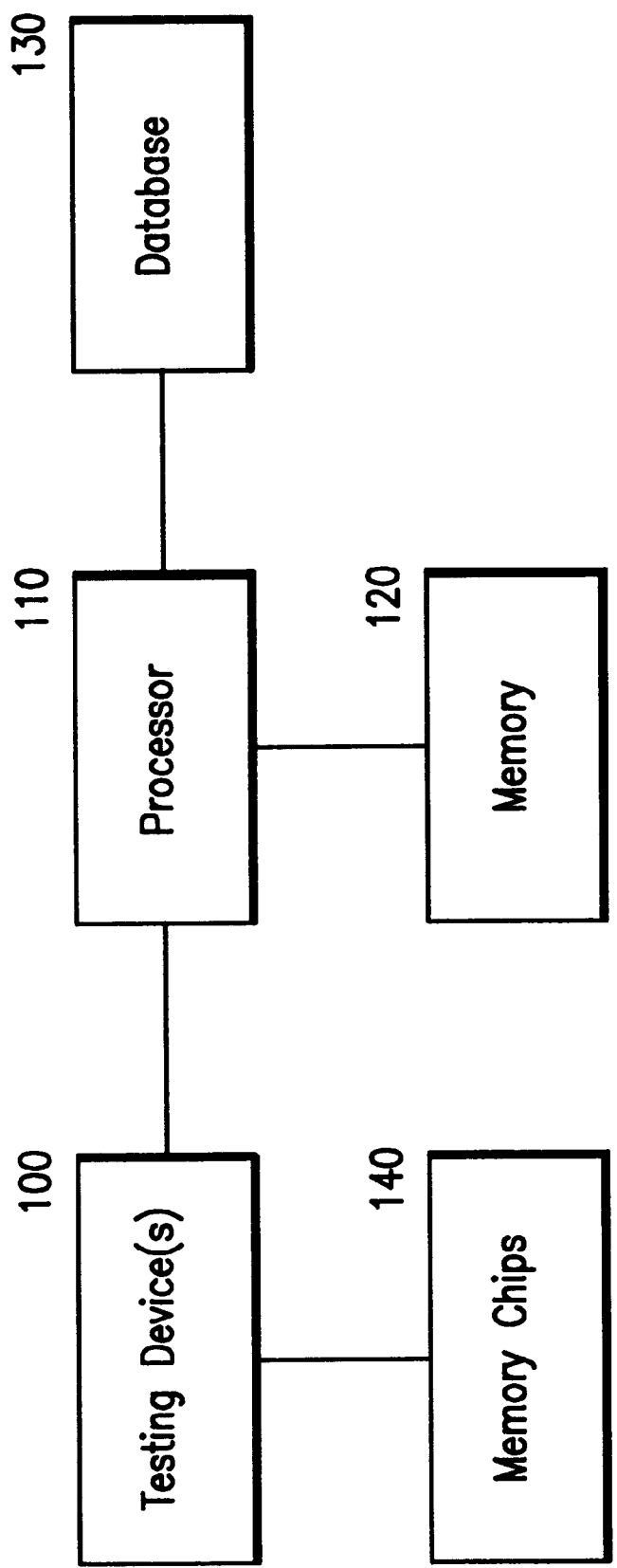
FIG. 1 is a block diagram of the system for testing a memory chip.
Figure 2A:
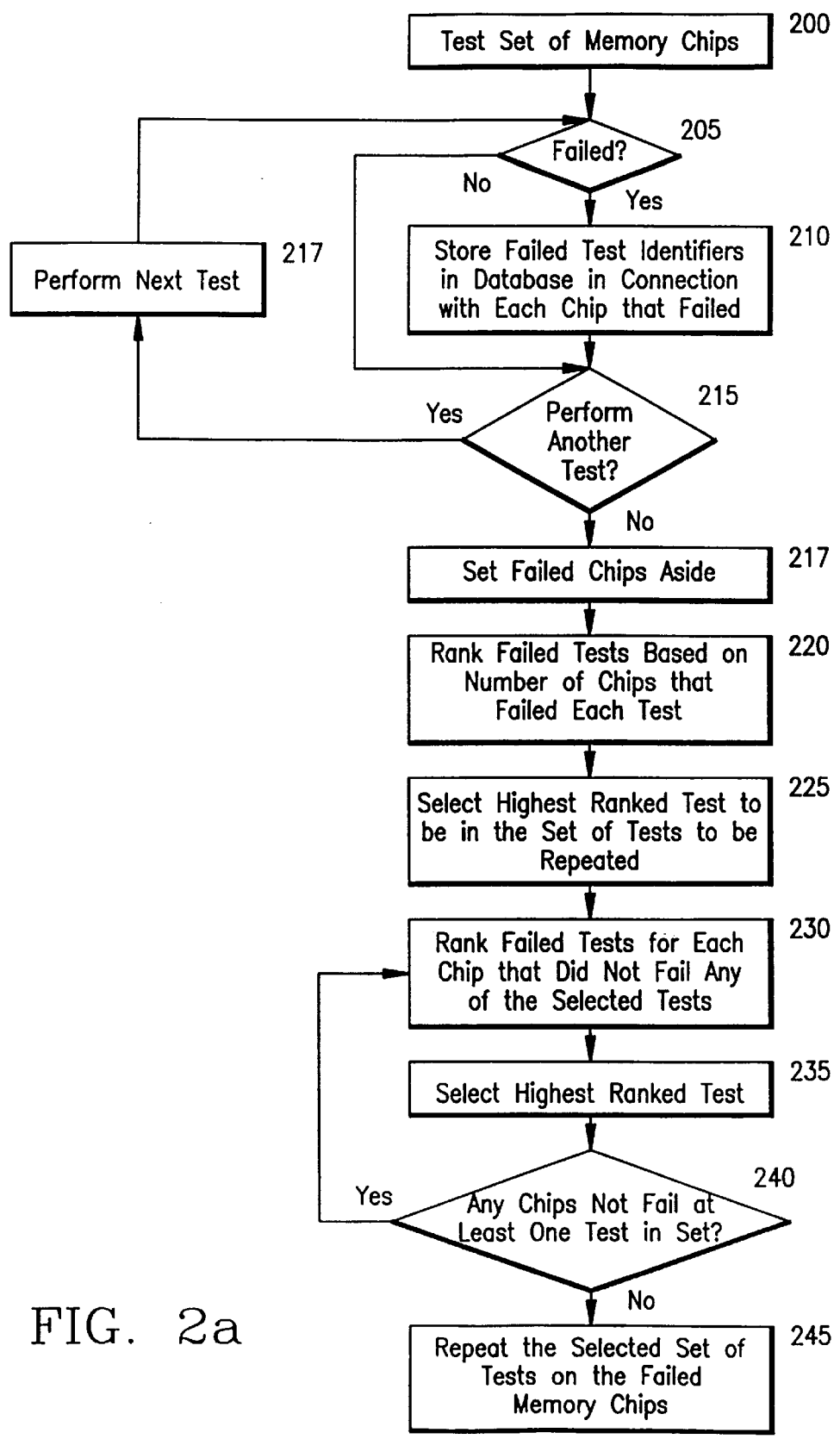
FIG. 2a shows a flow chart of the steps for performing an example test selection according to one implementation of the present invention.

FIG. 1 shows a block diagram of the memory chip or integrated circuit testing system in accordance with the present invention. Testing device 100 performs tests on a group of semiconductor memory chips 140, simultaneously. Preferably, 64 chips are tested at a time. Each memory chip has a unique identifier, preferably a fuse identifier having a series of selectively blown fuses corresponding to a unique binary number, located on the memory chip. Processor 110 oversees the testing performed by the testing device 100 and communicates with memory 120 that stores procedures for performing a variety of functions such as those outlined in the flow charts shown in FIGS. 2–4. In performing these procedures, the processor 110 accesses a database 130 that stores fuse identifiers in conjunction with test identifiers that identify tests that a specific memory chip failed.

In a preferred embodiment the database includes data in a format as shown below in Table 1. The first field indicates the number of tests that a memory chip failed, a plurality of fields list test numbers designating specific tests which the chip failed and the final field indicates the unique fuse identifier.

TABLE 1

|  | Tests Failed | | | | Fuse Identifier |
|---|---|---|---|---|---|
| Memory Chip 1 | 3 | 22 | 34 | 79 | 12345:12:1 |
| Memory Chip 2 | 1 | 88 | | | 12345:12:2 |

TABLE 1-continued

| | | Tests Failed | | | | Fuse Identifier |
|---|---|---|---|---|---|---|
| Memory Chip 3 | 4 | 22 | 33 | 34 | 79 | 12345:12:3 |
| Memory Chip 4 | 3 | 22 | 34 | 80 | | 12345:12:4 |

Using the example shown in Table 1 the benefits of the present invention will be further described. Using the system described in the Background of the Invention, after faulty memory chips have been set aside for repair, frequently failed tests, not necessarily actually failed tests, are rerun on the memory chips in order to determine the specific bits that may be faulty. If tests 22, 34, 35, 79, and 80 are considered the most commonly failed tests then memory chip 2 will not be repaired because it does not include any bits that will fail the listed tests.

In the repair step in accordance with the present invention, a better set of tests will be selected that only includes tests actually failed. This set of tests saves time because fewer tests need to be run and it allows for a more accurate repair. A detailed description of the testing and repair of semiconductor chips in accordance with the present invention will be set forth below.

First, preferably a group of 64 memory chips is tested beginning with a first test (step 200). If any one of these memory chips fails this test (step 205), a test identifier that identifies the failed test is stored in the database in the Tests Failed Field in conjunction with the fuse identifiers listed in the Fuse Identifier field for the corresponding failed memory chip(s) (step 210). Next, if none of the memory chips failed or after storing the failed test identifiers, the system determines whether another test needs to be performed (step 215). If so, the group of memory chips are passed through steps 200–215 until no tests remain. The defective chips are then set aside (step 217). Another group of 64 chips is then tested and passed through steps 200–215. Defective chips are set aside, and the testing of successive groups of chips continues until all chips have been tested and all defective chips have been set aside and identified. The process then continues with step 220.

In one implementation of the present invention, tests that were failed by a group of the defective memory chips, are ranked beginning with the most failed test (step 220). The highest ranked test in the group is selected to be placed in a set of tests to be repeated on the memory chips (step 225). Tests failed by chips in the group that did not fail the highest ranked test, are then ranked again (step 230). The highest ranked test among these remaining tests is also selected and inserted in the set of tests to be repeated (step 235). If any of the defective memory chips in the group did not fail one of the tests in the set of tests to be repeated (step 240), then steps 230–235 are repeated until the set of tests includes at least one test failed by each defective memory chip. The final set of tests are then repeated on the defective memory chips of the group (step 245). Preferably, 32 defective memory chips are included in each group.

Figure 2B:
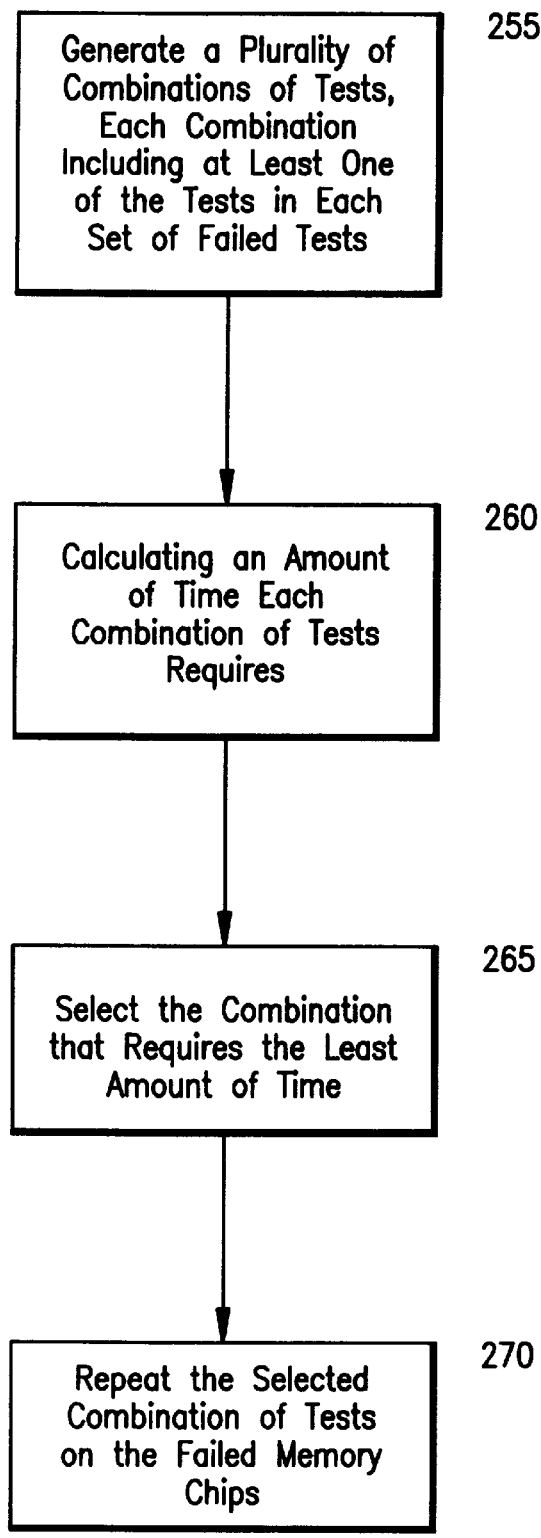
FIG. 2b shows a flow chart of the steps for performing an example test selection according to another implementation of the present invention.

In another implementation, shown in FIG. 2b, re-testing time is minimized. After each of the memory chips have been tested (step 215), the database includes a plurality of sets of failed tests for each failed chip of a group to be repaired such as those shown in Table 1. A plurality of combinations of tests are generated, wherein each combination includes at least one of the tests in each set of failed tests (step 255). For example, a few combinations of tests to be generated from Table 1 include, for example (3, 1, 4, and 80); (3, 88, 4, and 80); (3, 1, and 22); (22 and 88); and (34 and 88). An amount of time required to perform each test is known. Therefore, the time required to perform each combination of tests may be calculated by summing the time required for the individual tests (step 260). The combination of tests that requires the least amount of time is then selected (step 265). For instance, the set of tests 22 and 88 will be run instead of tests 34 and 88 when the time required to perform test 22 is less than the time required to perform test 34. The selected combination of tests are performed on each of the defective memory chips in the group (step 270).

The above-described selection of tests is repeated for successive groups until all defective chips have been repaired.

As discussed below, a set of tests is repeated on the memory chip in order to determine the location of defective bits or memory cells on the memory chips. Time will be saved because tests that were not failed by any of the memory chips will not be repeated. Nor will overlapping tests be run, such as when a plurality of memory chips all fail a common test, only that common test need be repeated.

Figure 3:
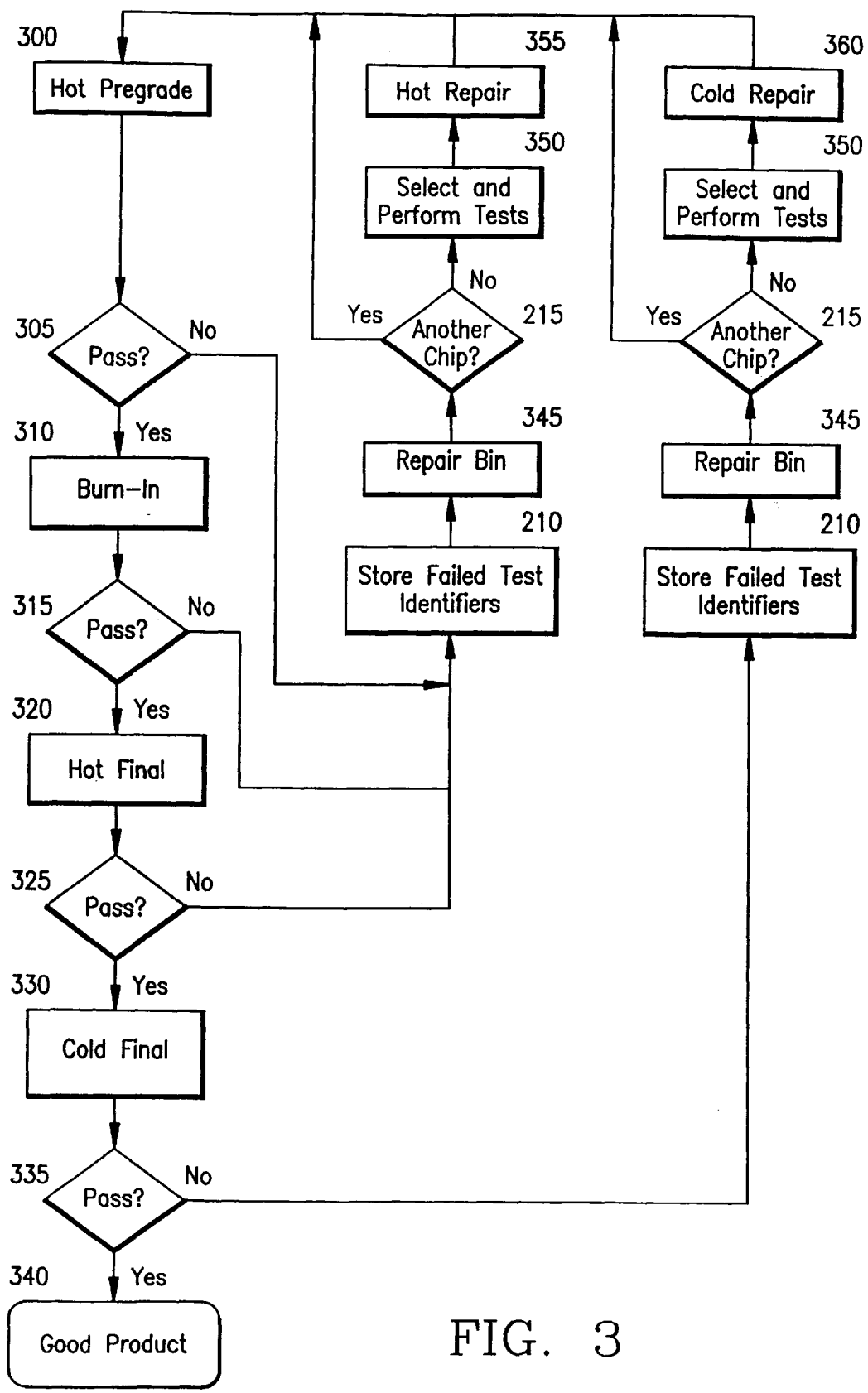
FIG. 3 shows an example DRAM test flow according to the present invention.

FIG. 3 shows an example DRAM test flow according to the present invention that begins by testing a memory chip using a hot pregrade step (step 300). The hot pregrade step involves performing tests such as speed grading, complex margin testing, and parametric testing all of which are performed at a temperature around 85° C. on a testing apparatus such as a circuit tester manufactured by Teradyne, Inc. As noted above, preferably, a group of 64 memory chips are tested at a time.

Margin testing is performed to determine the functionality of a memory chip and to determine what effect voltage has on the write and read functions of the memory chip. This test involves writing to a memory cell in a memory chip and reading from that same cell at a variety of very low and high voltages.

If it is determined that the memory chip failed any one of these tests (step 305), then the failed test numbers are stored in database 130 (step 210), and the memory chip is placed in a repair bin (step 345). If there are any other chips to be tested (step 215) then the next test is performed (step 217) and processing continues with step 300. Otherwise, tests are selected, using criteria such as that discussed above, and repeated (step 350). Any detected failed bits or memory cells are identified and hot repaired (step 355).

A memory chip that successfully passed the hot pregrade tests (step 300) is then further tested using burn-in tests (step 310) such as functional testing, and "infant mortality" stress which is preferably carried out for about 80 hours at a temperature of about 127° C. Infant mortalities are chip failures that occur under voltage or temperature stress. Memory chips include a polysilicon layer that may break off and cross conductive portions on the chip. An oxide layer can form between the broken off piece of the polysilicon layer and the conductive portions such that the conductive portions remain isolated. However, under voltage or temperature stress the oxide layer breaks down causing the polysilicon layer to short the conductive portions together. Therefore, by applying voltage or temperature stress to the chip, these failures are detected. Cold-burn testing may also be carried out with margin testing and functional testing at −10° C. to 85° C.

During the burn-in step (step 310), functional testing is performed by promoting failure using voltage and temperature stress. When it is determined that the memory chip fails any of the burn-in tests (step 315), then processing continues with step 210 as discussed above. Otherwise, the hot final tests are performed (step 320) for speed verification. These tests include complex margin testing, parametric testing, and are all preferably performed at 85° C. on a testing apparatus such as one circuit tester manufactured by Teradyne, Inc. When a memory chip fails any of the hot final tests (step 320), then processing continues with step 210 as discussed above.

Otherwise, testing continues with the cold final tests (step 330) that are also for speed verification and include complex margin testing, parametric testing, all performed preferably at −5° C. on the above-described Teradyne circuit tester.

Hot final and cold final testing are similar speed tests used to determine whether a memory chip has acceptable access times for the bits, the only difference being the temperature at which these tests are carried out. In order to determine how fast a chip is, the testing includes writing to a bit address and a set period of time later, attempting to read that address to determine whether the data is there. If the data is not there, then the memory chip fails this test.

When a memory chip fails one of the cold final tests (step 330), the failed test numbers are stored in database 130 (step 210), and the memory chip is set aside for repair (step 345). If there are any other chips to be tested (step 215) then testing of these chips continues with step 300. Otherwise, tests are selected, using criteria such as that discussed above, and repeated (step 350). Any detected failed bits or memory cells are identified and cold repaired (step 355). As noted above, preferably 32 chips are repaired at a time.

During the repair step identified failed bits or memory cells are repaired by replacing them with redundant bits or memory cells. The repaired chip is then preferably re-tested.

The memory chip is determined to be a good product when the memory chip passes all of the tests (step 340).

In an alternative embodiment all tests are performed before a failed memory chip is set aside so that the list of failed tests in the database is complete.

The present invention thus optimizes the testing and repair process for semiconductor memory chips. The invention accomplishes this by only performing redundancy analysis using a group of tests that a specific memory chip or group of memory chips has failed.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. For example, the present invention is not limited to testing and repair of memory chips, but any integrated circuit requiring testing and repair. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

I claim:

1. An apparatus for testing a plurality of integrated circuits, said apparatus comprising:

a testing device for performing a plurality of tests on said plurality of integrated circuits, each of said plurality of integrated circuits having a unique circuit identifier; and a processor to control said testing device, said processor identifying each of said plurality of integrated circuits that failed at least one of said plurality of tests and identifying tests failed by each of said plurality of integrated circuits, wherein said testing device repeats at least one identified failed test on each integrated circuits that failed at least one of said plurality of tests.

2. The apparatus for testing according to claim 1, wherein said unique circuit identifier is a fuse identifier having a series of selectively blown fuses corresponding to a unique binary number.

3. The apparatus for testing according to claim 1, wherein each of said plurality of tests has an associated test identifier.

4. The apparatus for testing according to claim 3, further comprising:

a memory, said memory storing said unique circuit identifier for each of said plurality of integrated circuits that failed at least one test in association with said test identifier for said failed at least one test.

5. The apparatus for testing according to claim 4, wherein said processor selects tests to be repeated by said testing device by retrieving at least one of said stored test identifiers for a failed test from said memory.

6. The apparatus for testing according to claim 5, wherein each failed integrated circuit has a set of associated failed test identifiers stored in said memory, and wherein said processor compares sets of failed test identifiers for each of said failed integrated circuits and selects a subset of tests that includes at least one test from each set of failed test identifiers.

7. The apparatus for testing according to claim 6, wherein said testing device repeats said subset of tests selected by said processor on each failed integrated circuit.

8. The apparatus for testing according to claim 7, wherein said processor determines an amount of time each test requires, sums the determined amounts of time for a plurality of combinations of tests, and selects a combination of tests that requires a minimal amount of time.

9. The apparatus for testing according to claim 8, wherein said processor ranks said identified failed tests in order of the highest number of integrated circuits failing each test, and selects the highest ranked test to be in said subset of tests.

10. The apparatus for testing according to claim 9, wherein said processor ranks said identified failed tests for each of said failed integrated circuits that remain that did not fail said highest ranked test in order of the highest number of integrated circuits that failed each of said failed tests that remain, and selects the highest ranked test of said identified failed tests for each of said remaining integrated circuits to be in said subset of tests.

11. The apparatus for testing according to claim 10, wherein said processor repeatedly ranks said identified failed tests and selects tests to be in said subset of tests until there are no identified integrated circuits that did not fail at least one test in said subset of tests.

12. The apparatus for testing according to claim 1, wherein said integrated circuits each include an array of memory cells and wherein said processor identifies at least one failed memory cell in said array of memory cells for each identified integrated circuit.

13. An apparatus for testing in accordance with claim 12, further comprising:

a repair device for repairing said identified at least one failed memory cell in each identified integrated circuit.

* * * * *

UNITED STATES PATENT AND TRADEMARK OFFICE
CERTIFICATE OF CORRECTION

PATENT NO. : 6,128,756

DATED : Oct. 3, 2000

INVENTOR(S) : Beffa

It is certified that errors appear in the above-identified patent and that said Letters Patent is hereby corrected as shown below:

In the Claims:

Claim 1, line 13, delete "circuits" and substitute --circuit--.

Signed and Sealed this

Seventeenth Day of April, 2001

*Attest:*

NICHOLAS P. GODICI

*Attesting Officer*     *Acting Director of the United States Patent and Trademark Office*